United States Patent [19]

Kuster et al.

[11] Patent Number: 4,592,602
[45] Date of Patent: Jun. 3, 1986

[54] MODULAR MOUNTING RACK SYSTEM OF VERTICAL-TYPE CONSTRUCTION

[75] Inventors: Manfred Kuster, Opfikon; Paul Weiss, Härkingen, both of Switzerland

[73] Assignee: Contraves AG, Zurich, Switzerland

[21] Appl. No.: 619,563

[22] Filed: Jun. 8, 1984

[30] Foreign Application Priority Data

Jun. 28, 1983 [CH] Switzerland .................. 3527/83

[51] Int. Cl.⁴ .............................................. A47B 88/00
[52] U.S. Cl. .................................. 312/223; 312/311; 312/330 R
[58] Field of Search ............... 312/330 R, 223, 311, 312/195, 196, 198, 199

[56] References Cited

U.S. PATENT DOCUMENTS

| | | | |
|---|---|---|---|
| 1,750,291 | 3/1930 | Whetstone | 312/330 R |
| 2,542,853 | 2/1951 | Wills | 312/223 |
| 2,899,253 | 8/1959 | Jacobs | 312/223 |
| 3,030,165 | 4/1962 | Nagy | 312/311 |
| 3,066,244 | 11/1962 | Defandorf et al. | |
| 3,088,054 | 4/1963 | Meyer | 312/223 |
| 4,050,752 | 9/1977 | Dykstra | 312/195 |
| 4,073,554 | 2/1978 | Oder et al. | 312/199 |

FOREIGN PATENT DOCUMENTS 2740971 3/1979 Fed. Rep. of Germany.
1307807 9/1962 France.
1307481 9/1962 France.
1559266 11/1962 France.

OTHER PUBLICATIONS

Publication entitled "Aluminium für Elektronik-Zübehör in Elektrotechnische Zeitschrift ETZ, vol. 101, issue No. 6, Mar. 1980.

Primary Examiner—Victor N. Sakran
Attorney, Agent, or Firm—Werner W. Kleeman

[57] ABSTRACT

A modularly structured mounting rack of vertical-type construction is proposed which is designed to receive electronic units or devices placed one above the other. The mounting rack substantially encompasses a rear wall module constituting a first constructional unit and a frame module constituting a second constructional unit. The rear wall module is of a substantially box-like structure to receive wiring and comprises a predetermined number of support elements arranged at individual wiring planes for supporting cables which are provided with plugs. At an end face of the rear wall module, specifically at the left-hand or right-hand side thereof, there are provided connection members arranged above each other which, in the assembled state of the two constructional units, are freely accessibly arranged for connection to appropriately laid external lines.

11 Claims, 4 Drawing Figures

MODULAR MOUNTING RACK SYSTEM OF VERTICAL-TYPE CONSTRUCTION

BACKGROUND OF THE INVENTION

The present invention relates to a new and improved modular system for a cabinet-like structured mounting rack of vertical-type construction.

In its more particular aspects, the present invention relates specifically to a new and improved modular system for a cabinet-like structured mounting rack of vertical-type construction, i.e. an upright rack system, for supporting a predetermined number of electronic units or devices which can be connected at wiring planes arranged above each other by means of plugs to appropriately run or laid and wired external lines or cables for communication, for other signalling purposes and for supplying power.

Such mounting racks for receiving electronic units or devices arranged on top of each other at a number of levels, are known in multifarious types of constructions. The increasing complexity and higher integration densities of the electronic units or devices result in an increase in the number of external and internal cables and plugs, so that the electronic units or devices and the mounting racks must be correspondingly structured, also while taking standardization into consideration. A preferred mode is the 19-inch mode of construction which is based on the width-dimension of the electronic units or devices, i.e. the standard 19 inch rack.

SUMMARY OF THE INVENTION

Therefore, with the foregoing in mind, it is a primary object of the present invention to provide a new and improved modular system for a cabinet-like structured mounting rack of vertical-type construction which is modified in such a manner that increased space for cable wiring is available in comparison to hitherto known prior art constructions.

Another important object of the present invention is directed to the provision of a new and improved modular system for a cabinet-like structured mounting rack of vertical-type construction in which the cable wiring is freely accessible.

Now in order to implement these and still further objects of the invention, which will become more readily apparent as the description proceeds, the modular system of the present development is manifested by the features that, the mounting rack is modularly structured and comprises a rear wall module constituting a first constructional unit and a frame module constituting a second constructional unit. The rear wall module is of a substantially box-like structure and includes a cavity or space to receive the wiring. The end face of the rear wall module which faces the frame module is provided with a clearance extending over the major portion of its area. In the individual wiring planes a related support element for the cable and the plugs connected thereto is provided. Adjacent the clearance or recess the end face is provided with connection members for the external lines. The frame module is releasably mounted at the end face of the rear wall module and has an inside or inner region containing a predetermined number of slide rails or extensible drawer-type rails for the electronic units or devices. In the assembled state of the two modular units the connection members are arranged in such a manner that they are freely accessible at the rear wall of the mounting rack.

The modular system according to the invention is distinguished by an assembly-facilitating accessibility of the external connection members and the internal plugs and of the wiring of the external lines at the rear wall as well as by the manner in which the cables are led to the electronic units or devices. Also, the modular system according to the invention requires a relatively small installation area. This is made possible because, on the one hand, the rear wall module constitutes a separate modular unit which can be wired and checked as such and, on the other hand, the external connection members are arranged to be freely accessible at the rear wall module of the mounting rack. Furthermore, in the modular system according to the invention, later extension or amplification of the wiring after removal of the electronic units or devices is possible and does not require any special effort or expense.

The freely accessible arrangement of the external connection members enables the external lines to be run thereto from the ceiling and/or from the floor. Particularly in the case of confined spatial conditions the mounting racks can be installed in a row and in a mutually contacting relationship.

BRIEF DESCRIPTION OF THE DRAWINGS

The invention will be better understood and objects other than those set forth above, will become apparent when consideration is given to the following detailed description thereof. Such description makes reference to the annexed drawings wherein throughout the various figures of the drawings there have been generally used the same reference characters to denote the same or analogous components and wherein.

DETAILED DESCRIPTION OF THE PREFERRED EMBODIMENTS

Figure 1:
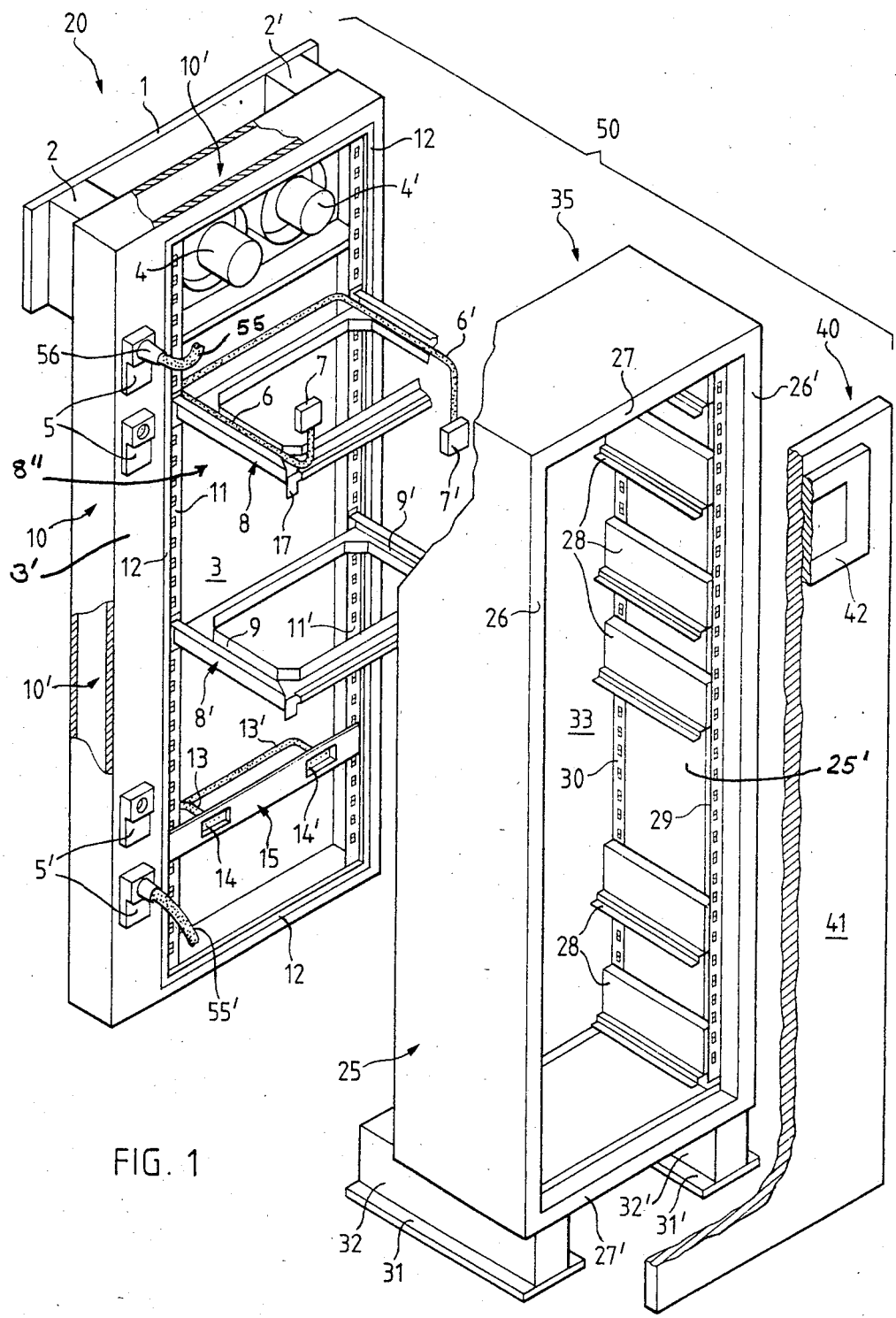
FIG. 1 is an exploded view in perspective of a modular system of a mounting rack of the vertical-type construction according to the invention for receiving electronic units or devices.
Figure 2:
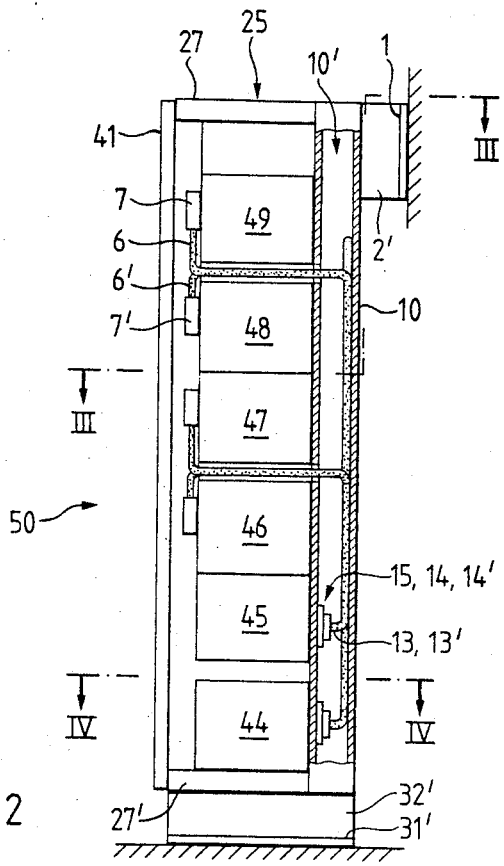
FIG. 2 is a schematic side view of the modular system as shown in FIG. 1 and illustrates the wiring concept or scheme thereof.

Describing now the drawings, it is to be understood that only enough of the construction of the modular system has been shown as needed to enable one skilled in the art to readily understand the underlying principles and concepts of the present development, while simplifying the showing of the drawings. Turning attention now specifically to FIG. 1, there has been illustrated in an exploded view the modular system of a mounting rack of vertical-type construction which is designated in its entirety by the reference numeral 50. As schematically shown in FIG. 2, the modular system illustrated in FIG. 1 is structured to support electronic units or devices 44, 45, 46, 47, 48 and 49 such that these units or devices are placed on top of each other, i.e. one above the other. The modularly structured mounting rack 50 substantially encompasses a first constructional unit 20, a second constructional unit 35 as well as a third constructional unit 40 which will be individually described hereinafter.

The first constructional unit 20, according to FIG. 1, is structured as a box-like rear wall module 10 and serves as a junction or interface between the external and internal wiring of appropriately run or laid external lines 55, 55' which are, for instance, communication lines, other than communication signalling lines and power supply lines. At an end face 3' of the rear wall module 10 connection members such as plug sockets 5, 5' are provided, preferably laterally thereof and one above the other. The rear wall module 10 defines a cavity or space 10' and the cables of the wiring which are arranged therein and not particularly illustrated are subdivided to define a predetermined number of wiring planes 8" which are arranged one above the other. Each wiring unit is led in the form of a bunched cable 6, 6' or 13, 13' to a related and correspondingly structured support element 8, 8' and 15.

The individual support element either may comprise a frame-like support structure 8, 8' or a traverse or cross bar 15. Each of the individual support elements can be substantially continuously vertically adjusted by plugging them into related anchoring holes provided in support ledges 11, 11' of the rear wall module 10. When the frame-like support structures 8, 8' are used, each of the cables 6, 6', which are provided with related plugs 7, 7' at one of their ends, is forwardly guided in a related channel 9, 9' which is laterally arranged at the frame-like support structure 8, 8'. When the traverses or cross bars 15 are used, of which only one is shown in FIG. 1, each one of the cables 13, 13' is run to a related schematically illustrated plug connector 14, 14' at the related traverse or cross bar 15.

For the aeration and cooling of the mounting rack 50 there are provided two ventilators 4, 4' which are integrated into the cavity or space 10' of the box-like structured rear wall module 10.

On the rear side of the rear wall module 10 there are provided two schematically illustrated vibration absorbers 2, 2' which are arranged in the upper region and at a bracket 1 in a spaced relationship. The vibration absorbers 2, 2' serve to reduce the effect of vibrations and impacts or shocks.

The substantially box-like structured rear wall module 10 is extensively open at the end face 3' thereof and is provided therein with a clearance or recess 3 which extends over a major portion of the area of the end face 3' for running the cables 6, 6' or 13, 13' therethrough. The rear wall module 10 further contains a circumferential groove which is not particularly illustrated and which is structured to receive a sealing member 12 which can be a so-called electromagnetically compatible seal. The connection members 5, 5' are arranged adjacent the clearance or recess 3.

The second constructional unit 35, according to FIG. 1, encompasses a frame module 25 substantially formed by two side walls 26, 26', a ceiling or top member 27 and a bottom member 27'. The frame module 25 defines a space 33 and an inside or inner region 25' and is equipped in conventional manner on the inside 25' thereof with a predetermined number of slide rails 28 are for receiving the electronic units or devices 44 to 49 shown in FIG. 2. In FIG. 1 there are only visible the slide rails 28 which are arranged on the inside or inner region 25' at the side wall 26'. In correspondence to the slide rails 28 arranged at the side wall 26', there are also provided such slide rails on the inside 25' at the side wall 26. Front and rear support ledges 29 and 30, respectively, are arranged at the frame module 25 and the slide rails 28 which are mutually correspondingly arranged at the side walls 26, 26' can be plugged into anchoring holes provided at the support ledges 29, 30. The slide rails 28 are substantially continuously vertically adjustable at the support ledges 29, 30. The frame module 25 is further equipped with two schematically illustrated vibration absorbers 32, 32' and base plates 31, 31' which are arranged in mutually spaced relationship and which are suitably mounted at the underside of the frame module 25.

A third constructional unit 40 is structured as a door module 41 which constitutes an end member of the mounting rack 50. The door module 41 is hinged in conventional manner to the frame module 25 using any suitable hinge elements or the like. The hinge elements are preferably structured as arresting members for the door module 41 in order to prevent unintentional closing of the door module 41 in the opened state thereof.

The sectional side view of FIG. 2 schematically illustrates the concept or scheme of the wiring arranged in the mounting rack 50. There will be recognized the electronic units or devices 44 to 49 which are arranged on top of each other in the frame module 25, the door module 41 as well as the rear wall module 10. In the upper region and as a first example the cables 6, 6' are led to the front from the cavity or space 10' and connected to the related one of the two electronic units or devices 48 and 49 by the related plugs 7 and 7'. In the lower region of the mounting rack 50 and as a second example the cables 13, 13' are led to related plug connectors or sockets 14, 14' which are arranged at the traverse or cross bar 15. In this example the electronic units or devices 44 and 45 are plugged into the plug connectors or sockets 14, 14' by means of correspondingly arranged and not particularly illustrated plugs.

Figure 3:
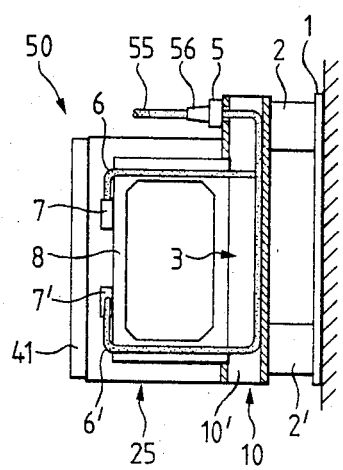
FIG. 3 is a section along the line III—III in FIG. 2.

The mounting rack 50 is schematically shown in FIG. 3 in a section taken along the line III—III in FIG. 2. There will be recognized the rear wall module 10 including the clearance or recess 3 and the cavity or space 10', the frame module 25, the door module 41 as well as the frame-like support structure 8 including the cables 6, 6' which are placed thereon and are run to the front thereof and the plugs 7, 7'. For reasons of better clarity the electronic unit or device 47 is not illustrated in FIG. 3.

Figure 4:
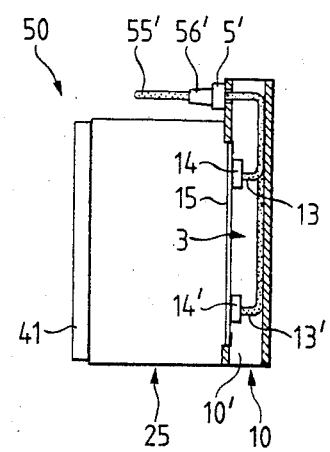
FIG. 4 is a section along the line IV—IV in FIG. 2.

The mounting rack 50 is schematically illustrated in FIG. 4 and in a section taken along the line IV—IV in FIG. 2. There will be recognized the rear wall module 10, the frame module 25, the door module 41, the traverse or cross bar 15 arranged within the cavity or space 10' and in the region of the clearance or recess 3 in the rear wall module 10, as well as the plug connectors 14, 14' at the traverse or cross bar 15 and the related cables 13, 13' which are appropriately connected to these plug connectors 14, 14'. For reasons of better clarity the electronic unit or device 44 is not illustrated in FIG. 4.

In the embodiment of the mounting rack 50 as described hereinbefore with reference to FIGS. 1 to 4 of the drawings, the connection members 5, 5' are arranged, for instance, on the left-hand side of the rear wall module 10. The incoming external lines 55, 55' can be plugged into the indivudual connection members 5, 5', which are arranged one above the other, by means of quick-action couplings 56, 56' which are only schematically illustrated in FIGS. 3 and 4.

The mounting rack 50 as described hereinbefore for receiving the electronic units or devices 44 to 49 can be particularly simply assembled and disassembled. Particularly the space requirement thereof which is related to the required installation area of the mounting rack 50, is relatively small in comparison to previously known mounting racks. Due to the modular-like structure of the mounting rack 50 it is ensured that the different electronic units or devices can be separately installed at the rear wall module 10 at relatively short distances and with optimal access from the front. In the same manner there is ensured ready checking of the not particularly illustrated wiring which is installed in the cavity or space 10'. After the installation and checking, the frame module 25 is centered by conventional means at the end face 3' of the rear wall module 10 and mounted thereto.

In the assembled state of the two constructional units 20 and 35 the wiring planes 8" which substantially comprise the related frame-like support structures 8, 8' and the related cables 6, 6' which are placed thereon, are arranged between the individual slide rails 28 which are provided for the slide-in of the electronic units or devices 44 to 49, see FIG. 2. Each of the individual frame-like support structures 8, 8' in the frontal region thereof preferably is equipped with two tongues 17 or equivalent structure which are shown in FIG. 1 and which serve to stabilize the mounting of the frame-like support structures 8, 8' at the frontal support ledges 29 of the frame module 25.

It is particularly noted at this point that the elements designated by the reference numeral 28 are shown as slide rails, but partially or in their entirety may comprise extensible drawer-type rails.

For inspection of the electronic units or devices 44 to 49 arranged at the mounting rack 50 the door module 41 is provided with a flap-like door 42 having a window.

Preferably, the mounting rack 50 as described hereinbefore is manufactured in a lightweight construction mode in which the individual constructional units 20, 35 and 40 are welded aluminum structures. A sufficient heat removal and aeration or venting of the mounting rack 50 is ensured by a number of ventilators of which two ventilators 4, 4' are illustrated in FIG. 1 as an example and by means of correspondingly arranged and not particularly illustrated vent openings. The vibration absorbers 2 and 32 which are arranged at the rear wall module 10 as well as at the frame module 25 substantially prevent transmission of vibrations and impacts and shocks.

The modular system of the mounting rack 50 according to the invention and substantially comprising the constructional units 20 and 35, i.e. the rear wall module 10 and the frame module 25, which are separately structured with respect to wiring and installation, enables a simple assembly and disassembly as compared to heretofore known modular systems. Since the connection members 5, 5' as shown in FIGS. 3 and 4 are laterally arranged and substantially exposed adjacent the side wall 26 of the frame module 25 in the assembled state of the constructional units 20 and 35, the required installation area or floor space of the mounting rack 50 has been substantially reduced. Furthermore, the arrangement of the connecting members 5, 5' ensures that the external lines 55, 55' can be simply brought up and connected to the connection members 5, 5' in such a manner as to be readily accessible from the front. The external lines 55, 55' can be led to the mounting racks from the ceiling as well as from the floor. The modular system of the mounting rack 50 according to the invention is particularly suited for confined or cramped spatial conditions as present, for example, in standard marine constructions and specifically in military naval constructions.

While there are shown and described present preferred embodiments of the invention, it is to be distinctly understood that the invention is not limited thereto, but may be otherwise variously embodied and practiced within the scope of the following claims.
ACCORDINGLY,

What is claimed is:

1. A modular system for a cabinet-like structured mounting rack of vertical construction for supporting a predetermined number of electronic units, said modular system comprising:

a substantially box-like rear wall module defining a cavity therein and having an end face;

said cavity being structured to receive a predetermined number of wiring cables leading to related ones of the electronic units;

a frame module releasably mounted to said end face of said rear wall module;

said rear wall module being provided at said end face thereof with a clearance extending over a major portion of the area of said end face;

said rear wall module defining a predetermined number of wiring planes located one above the other;

said rear wall module being provided with a predetermined number of support elements, each of which is associated with a related one of said wiring planes and supports at least one cable of said wiring cables;

said rear wall module being further provided, in a region adjacent said clearance, with a predetermined number of connection members each of which is connectable to related external lines and to a related one of said wiring cables;

said frame module containing an inner region and therein a multitude of support rails for supporting a related one of said electronic units; and said connection members at said end face of said rear wall module being freely accessible in the assembled state of the modular system.

2. The modular system as defined in claim 1, wherein:
said support rails in said inner region of said frame module constitute slide rails.

3. The modular system as defined in claim 1, wherein:
said support rails in said inner region of said frame module constitute extensible drawer-type rails.

4. The modular system as defined in claim 1, wherein:
said external lines constitute communication lines, non-communication signalling lines and power supply lines.

5. The modular system as defined in claim 1, wherein:
at least one of said support elements comprises a frame-like support structure and contains laterally arranged channels each of which guides said at least one cable.

6. The modular system as defined in claim 5, wherein:
said at least one support element, in the assembled state of the modular system, being arranged intermediate two of said support rails at said frame module;

said frame module defining a front side and being provided with support ledges at least at said front side thereof; and said at least one support element being mountable at said support ledges of said frame module in said assembled state of the modular system.

7. The modular system as defined in claim 1, wherein:
said rear wall module further comprises support ledges;
at least one of said support elements being designed as a traverse;
each said at least one traverse being mounted at said support ledges of said rear wall module;
each said wiring cable constituting at least two cables;
said at least one traverse being provided with at least two plug connectors in a mutually spaced relationship; and
each one of said at least two plug connectors being connected to a related one of said at least two cables.

8. The modular system as defined in claim 1, wherein:
said region in which said rear wall module is provided with said connection members is located on one side of said end face of said rear wall module; and
said connection members being substantially vertically placed one above the other.

9. The modular system as defined in claim 1, further including:
a door module; and
said rear wall module, said frame module and said door module constituting a lightweight construction.

10. The modular system as defined in claim 9, wherein:
said lightweight construction is formed as a welded aluminum structure.

11. The modular system as defined in claim 1, wherein:
said rear wall module constitutes a first constructional unit and said frame module constitutes a second constructional unit of the modular system.

* * * * *